United States Patent
Harada et al.

(10) Patent No.: US 7,382,040 B2
(45) Date of Patent: Jun. 3, 2008

(54) ORGANIC FIELD EFFECT TRANSISTOR AND DISPLAY USING SAME

(75) Inventors: Kenji Harada, Daitou (JP); Takayuki Takeuchi, Ibaraki (JP); Norishige Nanai, Hirakata (JP); Kazunori Komori, Sanda (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 128 days.

(21) Appl. No.: 10/557,059

(22) PCT Filed: Jan. 12, 2005

(86) PCT No.: PCT/JP2005/000249

§ 371 (c)(1),
(2), (4) Date: Nov. 16, 2005

(87) PCT Pub. No.: WO2005/069383

PCT Pub. Date: Jul. 28, 2005

(65) Prior Publication Data

US 2007/0012922 A1 Jan. 18, 2007

(30) Foreign Application Priority Data

Jan. 15, 2004 (JP) ............... 2004-008336

(51) Int. Cl.
*H01L 23/58* (2006.01)
(52) U.S. Cl. .............. 257/642; 257/59; 257/401; 257/E29.286
(58) Field of Classification Search ............... 257/642, 257/E29.286, 59, 401
See application file for complete search history.

(56) References Cited

U.S. PATENT DOCUMENTS

| 5,913,113 | A  | * | 6/1999 | Seo ............................ 438/166 |
| 6,518,949 | B2 | * | 2/2003 | Drzaic ........................ 345/107 |
| 6,747,287 | B1 | * | 6/2004 | Toguchi et al. ............... 257/40 |

(Continued)

FOREIGN PATENT DOCUMENTS

JP   2003-86804   3/2003

(Continued)

*Primary Examiner*—Howard Weiss
*Assistant Examiner*—John C Ingham
(74) *Attorney, Agent, or Firm*—Hamre, Schumann, Mueller & Larson, P.C.

(57) ABSTRACT

The present invention provides a field effect transistor that includes a semiconductor layer (15) containing an organic substance, and a first electrode (16), a second electrode (12), and a third electrode (14) that are not in contact with each other at least electrically. The first electrode (16) is arranged above the semiconductor layer (15), the second electrode (12) is arranged below the semiconductor layer (15), and the third electrode (14) is arranged beside the semiconductor layer (15). The semiconductor layer (15) is connected electrically to two electrodes selected from the first electrode (16), the second electrode (12), and the third electrode (14), and the electrically insulating layers (13,17) are interposed between the electrodes (12, 14, 16). The first electrode (16) lies over the semiconductor layer (15) so as to extend beyond the periphery of the semiconductor layer (15). With this configuration, it becomes possible to provide a field effect transistor that is highly resistant to air and water and thus has a long lifetime even though an organic semiconductor is used therein, and a display device using such a field effect transistor.

10 Claims, 10 Drawing Sheets

U.S. PATENT DOCUMENTS

| | | | |
|---|---|---|---|
| 6,885,041 B2 * | 4/2005 | Awano | 257/192 |
| 7,145,176 B2 * | 12/2006 | Kawasaki et al. | 257/72 |
| 2003/0151118 A1 * | 8/2003 | Baude et al. | 257/620 |
| 2004/0245523 A1 * | 12/2004 | Jen et al. | 257/59 |

FOREIGN PATENT DOCUMENTS

| | | |
|---|---|---|
| JP | 2003-110110 | 4/2003 |
| JP | 2003-209122 | 7/2003 |

* cited by examiner

ORGANIC FIELD EFFECT TRANSISTOR AND DISPLAY USING SAME

TECHNICAL FIELD

The present invention relates to a field effect transistor using a semiconductor layer containing an organic substance and to a display device using the transistor.

BACKGROUND ART

In recent years, organic semiconductors are being developed energetically as semiconductors that can be substituted for inorganic semiconductors. Representative examples of an organic semiconductor material include pentacene and polythiophene. In particular, it has been reported that when pentacene is used as a semiconductor in a field effect transistor, a carrier mobility, which is one of the transistor characteristics, achieved by the field effect transistor, can exceed 1 $cm^2/Vs$. In the case where amorphous silicon is used, the mobility achieved is about 1 $cm^2/Vs$. Thus, it is expected that organic semiconductors will replace amorphous silicon. However, in fact, there has been little progress toward such replacement. One major factor hindering the progress toward the replacement is the lifetime of organic semiconductors. Many of the organic semiconductors are susceptible to water and oxygen. Thus, there is a possibility that the semiconductor may be doped with oxygen present in an atmospheric gas so that an OFF current increases to decrease an ON/OFF ratio, resulting in degraded transistor characteristics. Therefore, it is necessary that an organic semiconductor material be stable with respect to oxygen and water so that, in a manufacturing process and a use environment, the doping due to the oxidation can be prevented or minimized. However, developing such an organic semiconductor material requires enormous cost and time.

In conventionally reported organic transistors, an oxide film or insulating resin is provided on an organic semiconductor so as to prevent the entry of oxygen and the like. Although the oxide film is highly resistant to oxygen and water, there has been a problem in that, when forming the oxide film on the semiconductor, a high film forming temperature is required so that the semiconductor may be damaged, degrading its characteristics. On the other hand, the resistance of the insulating resin to oxygen and water is not as high as that of the oxide film. Thus, it is difficult to improve the lifetime of the transistors sufficiently by the use of the insulating resin.

Moreover, the structures of the transistors also pose a problem. For example, in a bottom-gate type transistor, a semiconductor is exposed to the air, so that the contact area of the semiconductor with oxygen is large. In a top-gate type transistor, although the contact area of a semiconductor with oxygen is smaller than that in the bottom-gate type transistor, the semiconductor is vulnerable to oxygen entering from the direction perpendicular to the thickness direction. Furthermore, in a side-gate type transistor in which a semiconductor layer, a source electrode, and a drain electrode are laminated vertically and a gate electrode is formed beside this laminate via an insulating layer, the semiconductor is vulnerable to oxygen entering from the direction perpendicular to the thickness direction as in the case of the top-gate type transistor (see Patent Documents 1 and 2). Therefore, it is possible to improve the lifetime of a transistor by allowing the transistor to have a structure in which oxygen or water cannot enter easily from any directions, thereby protecting an organic semiconductor.

Patent Document 1: JP 2003-110110 A
Patent Document 2: JP 2003-209122 A

DISCLOSURE OF INVENTION

It is an object of the present invention to solve the above-described conventional problems and to provide a field effect transistor that is highly resistant to air and water and thus has a long lifetime even though it employs an organic semiconductor such as pentacene or polythiophene.

A field effect transistor according to the present invention includes: a semiconductor layer containing an organic substance; a first electrode; a second electrode; and a third electrode. The first electrode is arranged above the semiconductor layer, the second electrode is arranged below the semiconductor layer, and the third electrode is arranged beside the semiconductor layer. The semiconductor layer is connected electrically to two electrodes selected from the first electrode, the second electrode, and the third electrode, and the first electrode lies over the semiconductor layer so as to extend beyond a periphery of the semiconductor layer.

Furthermore, a display device according to the present invention includes an image display portion and a pixel electrode provided with the above-described field effect transistor.

DESCRIPTION OF THE INVENTION

The field effect transistor of the present invention is configured so that the first electrode is arranged on an upper surface of the semiconductor layer, the second electrode is arranged on a lower surface of the semiconductor layer, a lateral portion of the semiconductor layer is surrounded with the third electrode, and the first electrode lies over the semiconductor layer so as to extend beyond the periphery of the semiconductor layer. With this configuration, the distance from the atmosphere to the semiconductor layer can be made longer, so that oxygen or water has to travel a longer distance to reach the semiconductor layer. This allows the transistor to have a long lifetime.

The three electrodes used in the present invention are a gate electrode, a source electrode, and a drain electrode. A current flowing between the source electrode and the drain electrode is controlled by a voltage applied to the gate electrode. The current-flowing region of the semiconductor layer between the source electrode and the drain electrode is referred to as a channel.

In the present invention, it is preferable that $L \geq 10d$ is satisfied where L is a length by which the first electrode extends beyond the periphery of the semiconductor layer and d is a thickness of an insulating layer interposed between the first electrode and the third electrode. When the above relationship is satisfied, the distance from the atmosphere to the semiconductor layer can be made still longer, so that oxygen or water has to travel a longer distance to reach the semiconductor layer. This allows the transistor to have a long lifetime. More preferably, L and d satisfy $L \geq 50d$.

Preferably, an opening ratio indicating a ratio of a portion not surrounded with the third electrode at an outer side surface of the semiconductor layer to the entire outer side surface is not less than 0% and not more than 40%.

Furthermore, it is preferable that the first electrode is a drain/source electrode and is connected electrically to the semiconductor layer, the second electrode is a gate electrode, and the third electrode is a source/drain electrode and is connected electrically to the semiconductor layer.

Note here that the term "source/drain electrode" as used herein refers to a source electrode or a drain electrode, and the term "drain/source electrode" refers to a drain electrode or a source electrode. Accordingly, in the case where the source/drain electrode is a source electrode, the drain/source electrode is a drain electrode. On the other hand, in the case where the source/drain electrode is a drain electrode, the drain/source electrode is a source electrode.

Figure 1A:
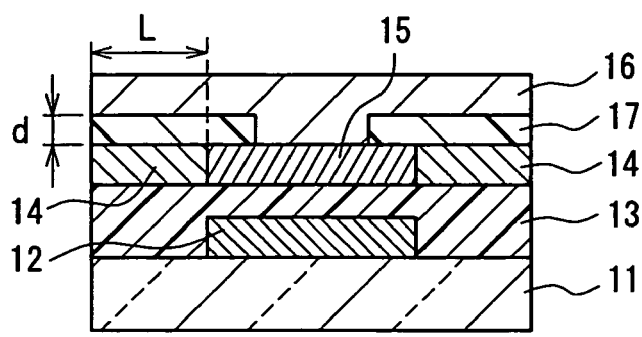
FIG. 1A is a schematic sectional view of a bottom-gate type field effect transistor according to Example 1 of the present invention.
Figure 1B:
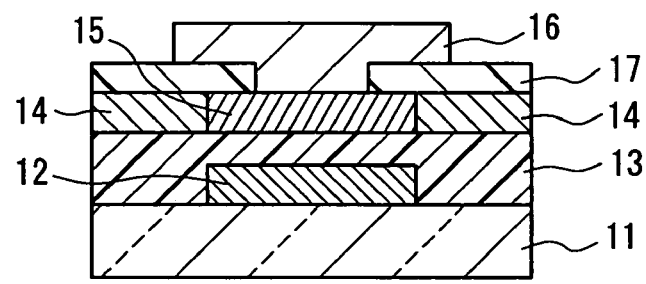
FIG. 1B is a schematic sectional view of another bottom-gate type field effect transistor of the present invention.
Figure 1C:
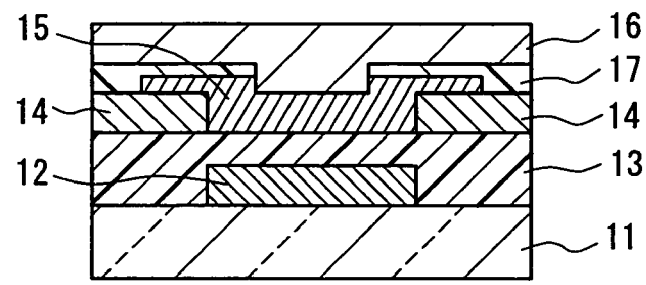
FIG. 1C is a schematic sectional view of still another bottom-gate type field effect transistor of the present invention.
Figure 1D:
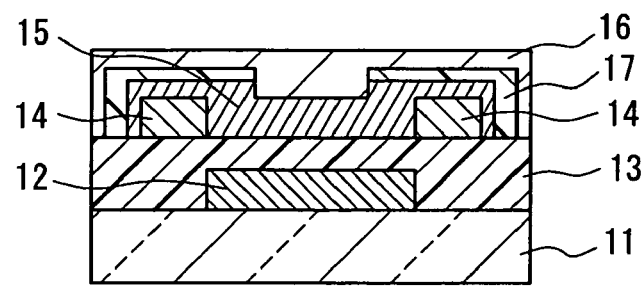
FIG. 1D is a schematic sectional view of still another bottom-gate type field effect transistor of the present invention.
Figure 1E:
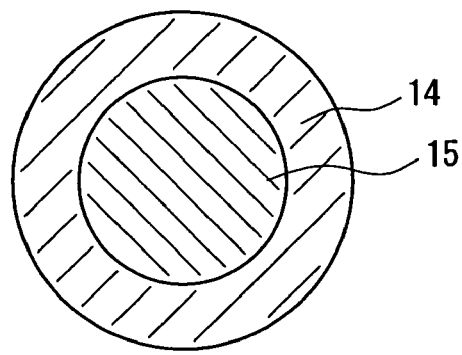
FIG. 1E is a sectional view showing main portions of the bottom-gate type field effect transistor of the present invention.

A bottom-gate type field effect transistor of the present invention may have various structures as shown in FIGS. 1A to 1E. FIG. 1A shows a bottom-gate type field effect transistor with a structure in which a gate electrode 12 as the second electrode is formed on a substrate 11, a gate insulating layer 13 is formed over the gate electrode 12, a source electrode 14 as the third electrode and a semiconductor layer 15 are formed on the gate insulating layer 13, and a drain electrode 16 as the first electrode and an insulating layer 17 are formed on the semiconductor layer 15 so as to cover the upper surface of the semiconductor layer 15 completely. Note here that the drain electrode 16 covers the upper surface of the semiconductor layer 15 completely either directly or via the insulating layer 17. Also note that the plan view of the source electrode 14 and the semiconductor layer 15 formed on the gate insulating layer 13 is such that, as shown in FIG. 1E, the entire lateral portion of the semiconductor layer 15 is surrounded with the source electrode 14.

FIG. 1B shows a structure in which the drain electrode 16 covers the upper surface of the semiconductor layer 15 completely either directly or via the insulating layer 17, with the upper surface of the insulating layer 17 partially being covered with the drain electrode 16.

FIG. 1C shows a structure in which the semiconductor layer 15 has a portion overhanging the source electrode 14, and the drain electrode 16 has a portion embedded in the semiconductor layer 15.

FIG. 1D shows a structure in which the semiconductor layer 15 covers most of the source electrode 14, and the drain electrode 16 covers the upper and side surfaces of the semiconductor layer 15 completely either directly or via the insulating layer 17.

Of course, the bottom-gate type field effect transistor according to the present invention may have a structure other than those shown in FIGS. 1A to 1D. Moreover, it is needless to say that a top-gate type field effect transistor and a side-gate type field effect transistor that will be described later also may have a structure other than those shown in the drawings referred to in the description.

Furthermore, it is preferable that $L \geq 10d$ is satisfied, where, as shown in FIG. 1A, L is a shortest distance from a point where a perpendicular line extending from an arbitrary point on the periphery of the semiconductor layer 15 intersects with the first electrode to the periphery of the first electrode and d is a distance between the first electrode and the semiconductor layer along the perpendicular line.

Still further, the field effect transistor may be configured so that the first electrode is a gate electrode, the second electrode is a drain/source electrode and is connected electrically to the semiconductor layer, and the third electrode is a source/drain electrode and is connected electrically to the semiconductor layer.

Still further, the field effect transistor may be a side-gate type field effect transistor configured so that the first electrode is one of a source electrode and a drain electrode whereas the second electrode is the other, the first electrode and the second electrode are connected electrically to the semiconductor layer, and the third electrode is a gate electrode.

As the substrate used for producing the field effect transistor of the present invention, it is desirable to use a substrate made of an inorganic material such as glass, quartz, or an alumina sintered body or to use an insulating substrate made of resin, such as a polyimide film or a polyester film, for example.

As a material of the gate electrode, it is desirable to use inorganic materials such as gold, platinum, silver, copper, aluminum, chromium, molybdenum, nickel, alloys of these metals, polysilicon, amorphous silicon, and ITO, for example. Such a conductive material is formed into a film having a thickness in the range from 50 nm to 500 nm by evaporation, sputtering, or the like and is processed into a desired shape by ordinary photolithography and etching processes.

Examples of a material of the gate insulating layer include inorganic insulating materials such as $SiO_2$ and $Al_2O_3$ and organic insulating materials such as polyacrylonitrile, polychloroprene, polyethylene terephthalate, polyoxymethylene, polycarbonate, and polyimide. The electrically insulating layer is formed so as to have a thickness in the range from 50 nm to 1000 nm by CVD, spin coating, casting, evaporation, or the like.

As a material of the source/drain electrode, an appropriate material can be selected from, for example, gold, platinum, silver, copper, aluminum, chromium, an indium-tin oxide alloy (ITO), and the like, depending on the material of the organic semiconductor layer. In particular, in order to achieve ohmic contact with the semiconductor layer, gold, platinum, and the like are used commonly. Such a conductive material is formed into a film having a thickness in the range from 50 nm to 500 nm by evaporation, sputtering, electron beam evaporation, or the like and is processed into a desired shape by ordinary photolithography and etching processes.

Examples of the semiconductor material include organic semiconductor materials such as polyacetylene, polypyrrole, polythiophene, polyaniline, polyacene (including tetracene and pentacene), poly-p-phenylene, polyphenylene sulfide, derivatives of these materials, and conductive polymers such as copolymers of these materials. Other than the above, composites of a carbon nanotube with the above described organic semiconductor materials also can be used as the semiconductor material. As the film-forming method, spin coating, casting, electrolytic polymerization, vapor phase polymerization, vacuum evaporation, or the like can be used.

EXAMPLES

Hereinafter, the present invention will be described more specifically by way of examples. However, it should be noted that the present invention is by no means limited to the examples given below.

Example 1

A field effect transistor No. 1 produced in the present example will be described with reference to FIG. 1A. FIG. 1A shows a bottom-gate type field effect transistor with a structure in which a gate electrode 12 is formed on a substrate 11, a gate insulating layer 13 is formed over the gate electrode 12, a source electrode 14 and a semiconductor layer 15 are formed on the gate insulating layer 13, and a drain electrode 16 and an insulating layer 17 are formed on the semiconductor layer 15 so as to cover the upper surface of the semiconductor layer 15 completely. Note here that the plan view of the source electrode 14 and the semiconductor layer 15 formed on the gate insulating layer 13 is such that, as shown in FIG. 1E, the entire lateral portion of the channel region of the semiconductor layer 15 is surrounded with the source electrode 14.

In the production of the field effect transistor No. 1, a 0.7 mm thick glass substrate was used as the substrate 11, a 0.1 μm thick indium-tin oxide alloy (ITO) layer was used as the gate electrode 12, a polyvinylphenol (PVP) layer that is 0.6 μm in thickness at a portion where the gate electrode is present and 0.7 μm in thickness at a portion where the gate electrode is not present was used as the gate insulating layer 13, a 0.1 μm thick gold layer was used as the source/drain electrode 14, a gold layer that was 0.1 μm in thickness at a portion above the insulating layer 17 was used as the source/drain electrode 16, a 50 nm thick photosensitive polyimide layer was used as the insulating layer 17, and a 100 nm thick pentacene layer was used as the semiconductor layer 15.

First, as the glass substrate 11, a washed glass substrate with an ITO film was provided. On this glass substrate 11, the PVP gate insulating layer was formed by spin coating. Thereafter, gold was deposited on the gate insulating layer 13 by vacuum evaporation with only a region of the gate insulating layer 13 where the semiconductor layer was to be formed being masked. Thus, the source electrode 14 was formed. Subsequently, the semiconductor layer 15 was formed by vacuum evaporation. Next, photosensitive polyimide was applied by spin coating, and the photosensitive polyimide at a portion where the drain electrode 16 was to be formed was removed by the irradiation of light. Thus, the insulating layer 17 was formed. Finally, gold was deposited by vacuum evaporation to form the drain electrode 16. As a result, the transistor in which the channel region of the semiconductor layer 15 was covered with the source and drain electrodes and the insulating layer as shown in FIG. 1A was obtained. The distance between the source electrode 14 arranged around the semiconductor layer 15 and the drain electrode 16, i.e., the thickness (d) of the insulating layer 17 was 50 nm and the length (L) by which the first electrode (drain electrode) 16 extended beyond the periphery of the semiconductor layer 15 was 50 μm. Thus, the relationship between L and d was L/d=1000.

The above-described ITO film was used as the gate electrode 12. On each of the source electrode 14, the drain electrode 16, and the gate electrode 12, a silver wire having a diameter of 0.1 mm was provided using a silver paste.

In order to evaluate the lifetime of the thus obtained transistor, the ON/OFF ratio of the transistor immediately after being produced was measured and compared with the ON/OFF ratio of the same after being left in a humidifying test machine for seven days. The humidified conditions created by the test machine were a temperature of 65° C. and a relative humidity of 85%.

As clear from Table 1 below, which shows the measurement results with regard to the transistors No. 1 through No. 11 together, the field effect transistor No. 1 immediately after being produced exhibited a carrier mobility of 0.06 $cm^2$/Vs and a current ON/OFF ratio of $5 \times 10^5$. The field effect transistor No. 1 after being left in the humidifying test machine exhibited an ON/OFF ratio of $9 \times 10^2$. It should be noted here that if conventional transistors are left in an atmosphere for seven days after being produced, they no longer can exhibit transistor characteristics. Thus, it is understood that the transistor having the structure as shown in FIG. 1A can exhibit improved resistance to oxygen and water.

Comparative Example 1

Figure 13:
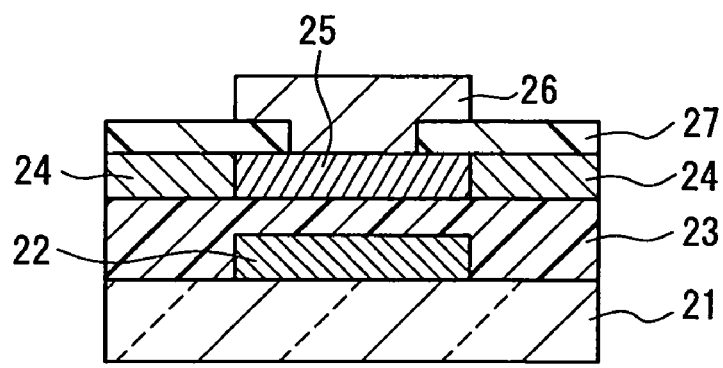
FIG. 13 is a schematic sectional view of a bottom-gate type field effect transistor according to Comparative Example 1.

For the sake of comparison, a field effect transistor No. 2 in which the periphery of a drain electrode 26 was substantially the same as that of a semiconductor layer 25 as shown in FIG. 13 was produced in the same manner as in Example 1. The thickness (d) of an insulating layer 27 was 50 nm and the length (L) by which the first electrode (drain electrode) 26 extended beyond the periphery of the semiconductor layer 25 was 0.05 μm. Thus, the relationship between L and d was L/d=1. As clear from Table 1 below, which shows the measurement results with regard to the transistors No. 1 through No. 11 together, the transistor No. 2 immediately after being produced exhibited a carrier mobility of 0.04 $cm^2$/Vs and a current ON/OFF ratio of $4\times10^5$. The ON/OFF ratio of the transistor No. 2 after being left in the humidifying test machine was so small that it could not be measured. The reason for this is considered to be that, in the transistor with the structure as shown in FIG. 13, the distance oxygen or the like needs to travel to reach the semiconductor layer is shorter than in the transistor with the structure as shown in FIG. 1A. That is, since oxygen or water could enter the semiconductor layer easily, the semiconductor layer was doped with the oxygen or water and degraded chemically, resulting in the degraded transistor characteristics.

Example 2

Figure 2A:
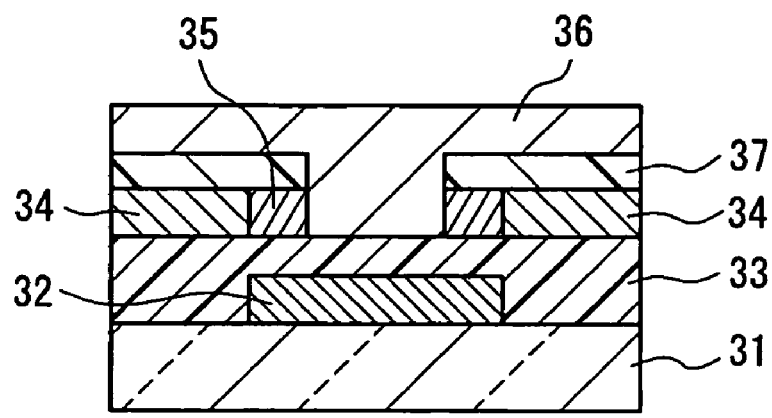
FIG. 2A is a schematic sectional view of a bottom-gate type field effect transistor according to Example 2 or 3 of the present invention.
Figure 2B:
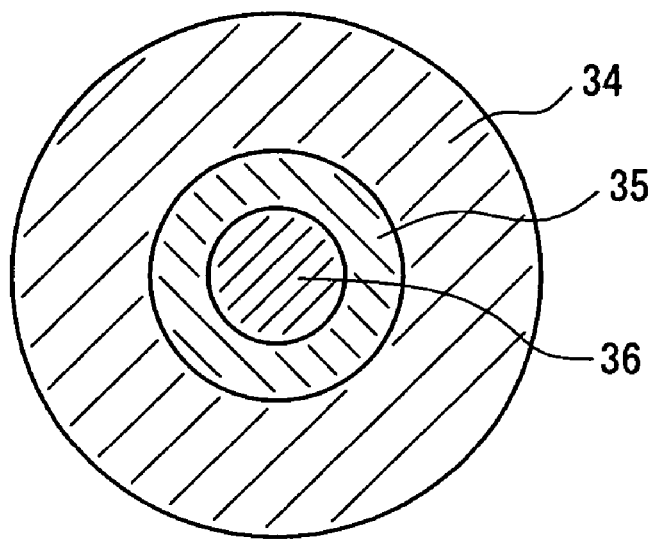
FIG. 2B is a sectional view showing main portions of the bottom-gate type field effect transistor according to Example 2.

A field effect transistor No. 3 produced in the present example will be described with reference to FIGS. 2A and 2B. FIG. 2A shows a bottom-gate type field effect transistor with a structure in which a gate electrode 32 is formed on a substrate 31, a gate insulating layer 33 is formed over the gate electrode 32, a source electrode 34, a drain electrode 36, and a semiconductor layer 35 are formed on the gate insulating layer 33, and the drain electrode 36 and an insulating layer 37 are formed on the semiconductor layer 35 so as to cover the upper surface of the semiconductor layer 35 completely. Note here that the drain electrode 36 covers the upper surface of the semiconductor layer 35 completely via the insulating layer 37. Also note that, as shown in the sectional view of FIG. 2B, the source electrode 34, the drain electrode 36, and the semiconductor layer 35 are formed on the gate insulating layer 33 so that the drain electrode 36 is at the central portion of the semiconductor layer 35 and the entire lateral portion of the channel region of the semiconductor layer 35 is surrounded with the source electrode 34.

In the production of the field effect transistor No. 3, a glass substrate was used as the substrate 31, ITO was used to form the gate electrode 32, PVP was used to form the gate insulating layer 33, gold was used to form the source electrode 34 and the drain electrode 36, photosensitive polyimide was used to form the insulating layer 37, and pentacene was used to form the semiconductor layer 35. The thickness (d) of the insulating layer 37 was 50 nm and the length (L) by which the first electrode (drain electrode) 36 extended beyond the periphery of the semiconductor layer 35 was 50 μm. Thus, the relationship between L and d was L/d=1000.

First, as the glass substrate 31, a washed glass substrate with an ITO film was provided. On this glass substrate 31, the PVP gate insulating layer 33 was formed by spin coating. Thereafter, gold was deposited on the gate insulating layer 33 by vacuum evaporation with only a region of the gate insulating layer 33 where the semiconductor layer was to be formed being masked. Thus, the source electrode 34 and a part of the drain electrode 36 were formed. Subsequently, the semiconductor layer 35 was formed by vacuum evaporation. Next, photosensitive polyimide was applied by spin coating, and the photosensitive polyimide at a portion where the drain electrode 36 was to be formed was removed by the irradiation of light. Thus, the insulating layer 37 was formed. Finally, gold was deposited by vacuum evaporation to form the drain electrode 36. As a result, the transistor in which the channel region of the semiconductor layer 35 was covered with the source and drain electrodes and the insulating layer as shown in FIG. 2A was obtained. The above-described ITO film was used as the gate electrode 32. On each of the source electrode 34, the drain electrode 36, and the gate electrode 32, a silver wire having a diameter of 0.1 mm was provided using a silver paste. The lifetime of the thus obtained transistor was evaluated in the same manner as in Example 1.

As clear from Table 1 below, which shows the measurement results with regard to the transistors No. 1 through No. 11 together, the field effect transistor No. 3 immediately after being produced exhibited a carrier mobility of 0.1 $cm^2$/Vs and a current ON/OFF ratio of $4\times10^5$. The field effect transistor No. 3 after being left in the humidifying test machine exhibited an ON/OFF ratio of $4\times10^2$. Thus, it is understood that the field effect transistor No. 3 exhibited improved resistance to oxygen and water.

Example 3

Figure 2C:
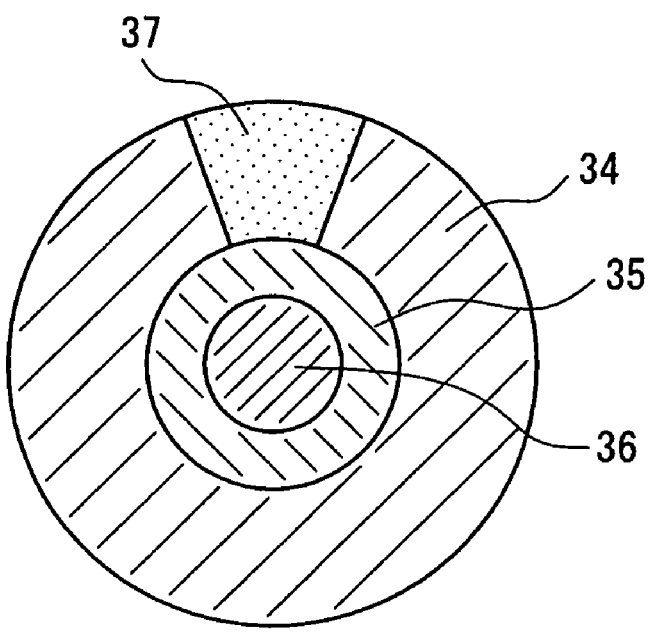
FIG. 2C is a sectional view showing main portions of the bottom-gate type field effect transistor according to Example 3.

Field effect transistors Nos. 21 to 26 produced in the present example will be described with reference to FIGS. 2A and 2C. In the same manner as in Example 2, bottom-gate type transistors were produced in which, as shown in FIG. 2A, the drain electrode 36 covered the upper surfaces of the semiconductor layer 35 and the source electrode 34 via the insulating layer 37. The thickness (d) of the insulating layer 37 was 50 nm and the length (L) by which the first electrode (drain electrode) 36 extended beyond the periphery of the semiconductor layer 35 was 50 μm. Thus, the relationship between L and d was L/d=1000. However, in the present example, the plan view of the source electrode 34, the drain electrode 36, and the semiconductor layer 35 formed on the gate insulating layer 33 was such that, as shown in FIG. 2C, the drain electrode 36 was at the central portion of the semiconductor layer 35 and the most of the lateral portion of the channel region of the semiconductor layer 35 was surrounded with the source electrode 34. Table 2 shows how an ON/OFF ratio varied depending on an opening ratio indicating a ratio of the portion not surrounded with the source electrode 34 in the channel region of the semiconductor layer. In the transistors Nos. 21 to 26, the opening ratio was varied within the range from 0% to 50%. It should be noted here that the term "opening ratio" refers to a ratio of the area of the opening on a side surface of the channel region to the area of the entire side surface. That is, when the opening ratio is 0%, the entire lateral portion of the channel region is surrounded with the source electrode.

As shown in Table 2, the field effect transistors with various opening ratios from 0% to 50% exhibited a carrier mobility of 0.07 to 0.1 $cm^2$/Vs and a current ON/OFF ratio of at least $1\times10^5$ immediately after they were produced. These field effect transistors then were left in the humidifying test machine, and a time period that had elapsed until the ON/OFF ratio became smaller than $1\times10^2$ was measured as the lifetime of the field effect transistors.

Figure 10:
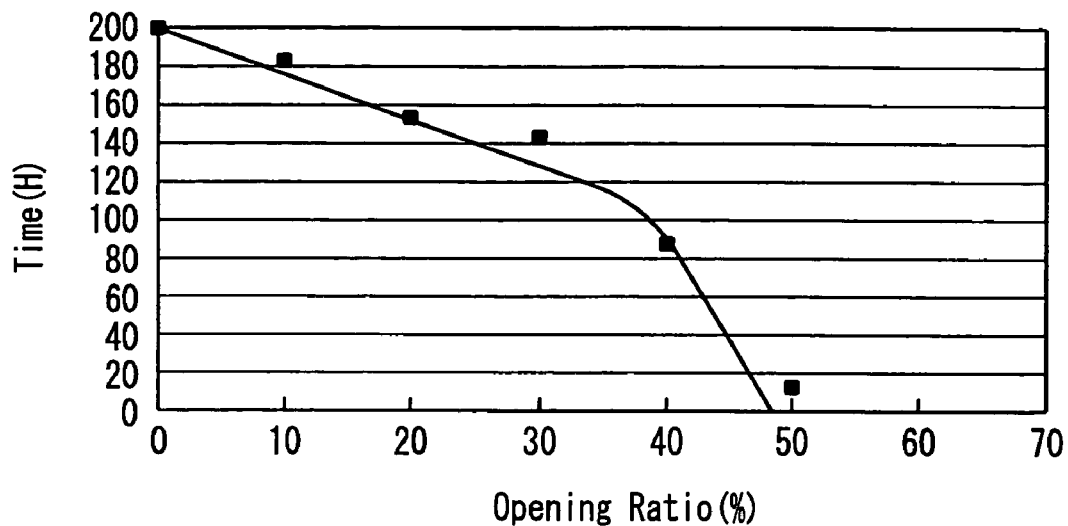
FIG. 10 shows the correlation between an opening ratio of a semiconductor layer and a lifetime of the field effect transistor according to Example 3 of the present invention.

As a result, as shown in FIG. 10, the lifetime decreased monotonically with an increase in opening ratio before the opening ratio exceeded approximately 30%. However, it was found that the lifetime decreased sharply after the opening ratio exceeded approximately 40%. When the opening ratio was up to about 30%, the cause of the decrease in lifetime is considered to be that a larger amount of oxygen and the like was allowed to enter the semiconductor layer due to an increase in opening area of the semiconductor layer. However, when the opening ratio was 40% or more, the sharp decrease in the lifetime of the semiconductor layer occurred because electric charge concentration accompanying the decrease in electrode area caused chemical degradation of the semiconductor layer to proceed rapidly.

From these results, it can be said that, considering the stability of the transistor in use, it is preferable that the lateral portion of the channel region is surrounded with the source electrode so that the opening ratio is in the range causing no sharp decrease in lifetime, i.e., not more than 40%.

Example 4

Figure 3:
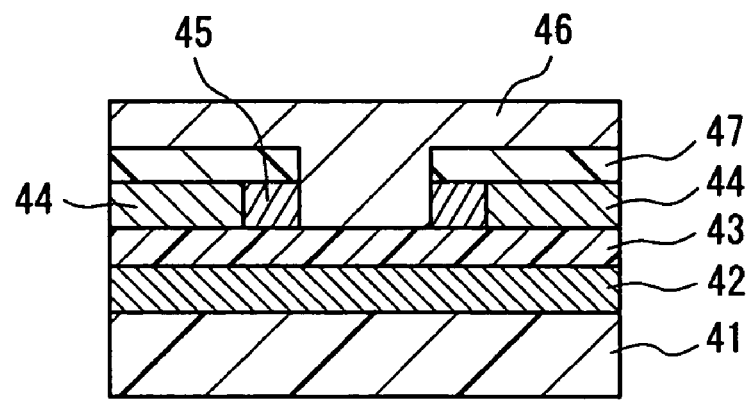
FIG. 3 is a schematic sectional view of a bottom-gate type field effect transistor according to Example 4 of the present invention.

A field effect transistor No. 4 produced in the present example will be described with reference to FIG. 3. FIG. 3 shows a bottom-gate type field effect transistor with a structure in which a gate electrode 42 is formed on a substrate 41, a gate insulating layer 43 is formed on the gate electrode 42, a source electrode 44, a drain electrode 46, and a semiconductor layer 45 are formed on the gate insulating layer 43, and the drain electrode 46 and an insulating layer 47 are formed on the semiconductor layer 45 so as to cover the upper surface of the semiconductor layer 45 completely. Note here that the drain electrode 46 covers the upper surface of the semiconductor layer 45 completely via the insulating layer 47. Also note that the gate electrode 42 covers the lower surface of the semiconductor layer 45 completely via the gate insulating layer 43. Moreover, the plan view of the source electrode 44, the drain electrode 46, and the semiconductor layer 45 formed on the gate insulating layer 43 is such that the drain electrode 46 is at the central portion of the semiconductor layer 45 and the entire lateral portion of the channel region of the semiconductor layer 45 is surrounded with the source electrode 44. The thickness (d) of the insulating layer 47 was 50 nm and the length (L) by which the first electrode (drain electrode) 46 extended beyond the periphery of the semiconductor layer 45 was 50 μm. Thus, the relationship between L and d was L/d=1000.

In the production of the field effect transistor No. 4, a resin substrate was used as the substrate 41, ITO was used to form the gate electrode 42, PVP was used to form the gate insulating layer 43, gold was used to form the source electrode 44 and the drain electrode 46, photosensitive polyimide was used to form the insulating layer 47, and pentacene was used to form the semiconductor layer 45.

First, as the glass substrate 41, a 1 mm thick washed polyimide resin substrate with the ITO film 42 was provided. On this substrate 41, the PVP gate insulating layer 43 was formed by spin coating. Thereafter, gold was deposited on the gate insulating layer 43 by vacuum evaporation with only a region of the gate insulating layer 43 where the semiconductor layer was to be formed being masked. Thus, the source electrode 44 and a part of the drain electrode 46 were formed. Subsequently, the semiconductor layer 45 was formed by vacuum evaporation. Next, photosensitive polyimide was applied by spin coating, and the photosensitive polyimide at a portion where the drain electrode 46 was to be formed was removed by the irradiation of light. Thus, the insulating layer 47 was formed. Finally, gold was deposited by vacuum evaporation to form the drain electrode 46. As a result, the transistor No. 4 in which the semiconductor layer 45 was covered with the source and drain electrodes and the insulating layer was obtained. The above-described ITO film was used as the gate electrode 42. On each of the source electrode 44, the drain electrode 46, and the gate electrode 42, a silver wire having a diameter of 0.1 mm was provided using a silver paste. The lifetime of the thus obtained transistor was evaluated in the same manner as in Example 1.

As clear from Table 1 below, which shows the measurement results with regard to the transistors No. 1 through No. 11 together, the field effect transistor No. 4 immediately after being produced exhibited a carrier mobility of 0.03 m²/Vs and a current ON/OFF ratio of $2\times10^5$. The field effect transistor No. 4 after being left in the humidifying test machine exhibited an ON/OFF ratio of $1\times10^2$. Thus, it was confirmed that, in the case where the substrate made of resin was used, the field effect transistor exhibited improved resistance to oxygen and water.

Example 5

Figure 4A:
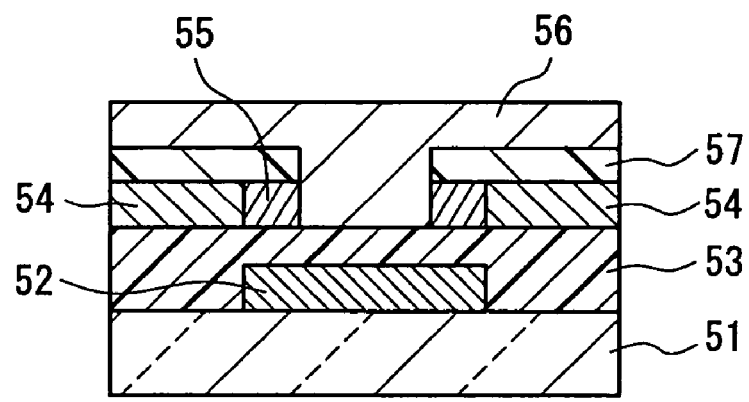
FIG. 4A is a schematic sectional view of a bottom-gate type field effect transistor according to Example 5 of the present invention.
Figure 4B:
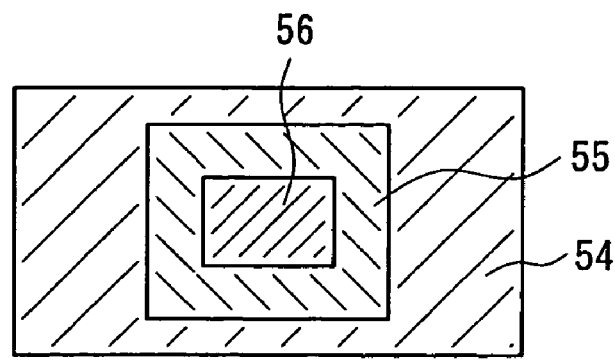
FIG. 4B is a sectional view showing main portions of the same.

A field effect transistor No. 5 produced in the present example will be described with reference to FIGS. 4A and 4B. FIG. 4A shows a bottom-gate type field effect transistor with a structure in which a gate electrode 52 is formed on a substrate 51, a gate insulating layer 53 is formed over the gate electrode 52, a source electrode 54, a drain electrode 56, and a semiconductor layer 55 are formed on the gate insulating layer 53, and the drain electrode 56 and an insulating layer 57 are formed on the semiconductor layer 55 so as to cover the upper surface of the semiconductor layer 55 completely. Note here that the drain electrode 56 covers the upper surface of the semiconductor layer 55 completely via the insulating layer 57. Moreover, the plan view of the source electrode 54, the drain electrode 56, and the semiconductor layer 55 formed on the gate insulating layer 53 is such that, as shown in FIG. 4B, the drain electrode 56 is at the central portion of the semiconductor layer 55 and the entire lateral portion of the channel region of the semiconductor layer 55 is surrounded with the source electrode 54. The thickness (d) of the insulating layer 57 was 50 nm and the length (L) by which the first electrode (drain electrode) 56 extended beyond the periphery of the semiconductor layer 45 was 50 μm. Thus, the relationship between L and d was L/d=1000.

In the production of the field effect transistor No. 5, a glass substrate was used as the substrate 51, ITO was used to form the gate electrode 52, PVP was used to form the gate insulating layer 53, gold was used to form the source electrode 54 and the drain electrode 56, photosensitive polyimide was used to form the insulating layer 57, and pentacene was used to form the semiconductor layer 55.

First, as the glass substrate 51, a washed glass substrate with an ITO film was provided. On this substrate 51, the PVP gate insulating layer 53 was formed by spin coating. Thereafter, gold was deposited on the gate insulating layer 53 by vacuum evaporation with only a region of the gate insulating layer 53 where the semiconductor layer was to be formed being masked. Thus, the source electrode 54 and a part of the drain electrode 56 were formed. Subsequently, the semiconductor layer 55 was formed by vacuum evaporation. Next, photosensitive polyimide was applied by spin coating, and the photosensitive polyimide at a portion where the drain electrode 56 was to be formed was removed by the irradiation of light. Thus, the insulating layer 57 was formed. Finally, gold was deposited by vacuum evaporation to form the drain electrode 56. As a result, the transistor No. 5 in which the semiconductor layer 55 was covered with the source and drain electrodes and the insulating layer was obtained. The shortest distance between the source electrode 54 and the drain electrode 56 via the semiconductor layer 55 was set to 50 nm. The above-described ITO film was used as the gate electrode 52. On each of the source electrode 54, the drain electrode 56, and the gate electrode 52, a silver wire having a diameter of 0.1 mm was provided using a silver paste. The lifetime of the thus obtained transistor was evaluated in the same manner as in Example 1.

As clear from Table 1 below, which shows the measurement results with regard to the transistors No. 1 through No. 11 together, the field effect transistor No. 5 immediately after being produced exhibited a carrier mobility of 0.01 cm$^2$/Vs and a current ON/OFF ratio of $6\times10^4$. The field effect transistor No. 5 after being left in the humidifying test machine exhibited an ON/OFF ratio of $1\times10^2$. From these results, it is understood that the field effect transistor exhibited improved resistance to oxygen and water regardless of the shapes of the source and drain electrodes and the semiconductor layer.

Example 6

Figure 5A:
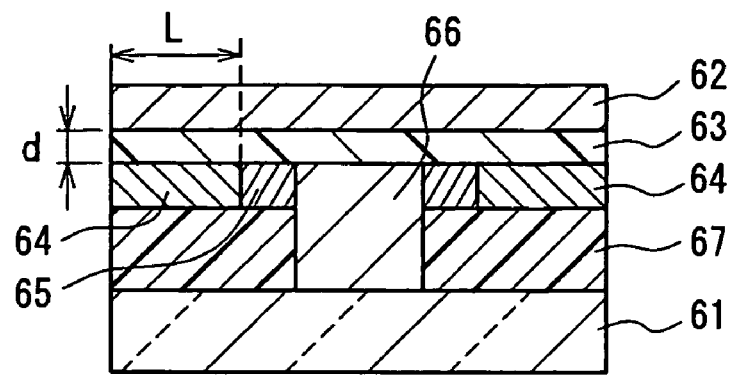
FIG. 5A is a schematic sectional view of a top-gate type field effect transistor according to Example 6 or 7 of the present invention.
Figure 5B:
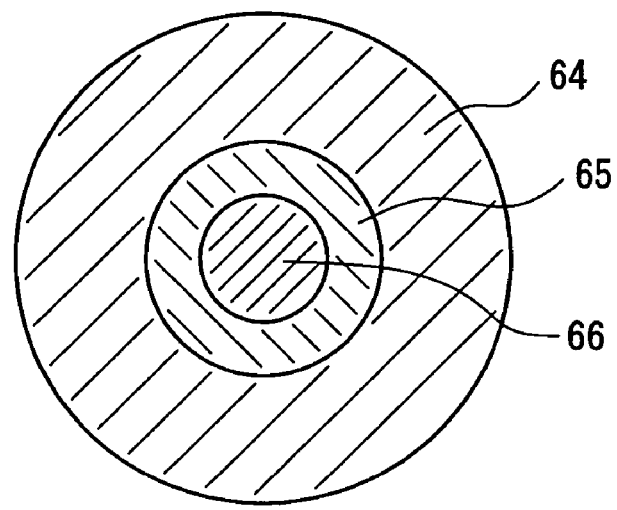
FIG. 5B is a sectional view showing main portions of the top-gate type field effect transistor according to Example 6.

A field effect transistor No. 6 produced in the present example will be described with reference to FIGS. 5A and 5B. FIG. 5A shows a top-gate type field effect transistor with a structure in which a drain electrode 66 and an insulating layer 67 are formed on a substrate 61, a source electrode 64 and a semiconductor layer 65 are formed on the insulating layer 67, and a gate insulating layer 63 and a gate electrode 62 further are formed thereon in this order. Note here that the gate electrode 62 covers the upper surface of the semiconductor layer 65 completely. Also note that, as shown in FIG. 5B, the drain electrode 66 is at the central portion of the semiconductor layer 65 and the entire lateral portion of the channel region of the semiconductor layer 65 is surrounded with the source electrode 64. The thickness (d) of the insulating layer 63 was 500 nm and the length (L) by which the first electrode (gate electrode) 62 extended beyond the periphery of the semiconductor layer 65 was 50 μm. Thus, the relationship between L and d was L/d=100.

In the production of the field effect transistor No. 6, a glass substrate was used as the substrate 61, gold was used to form the source electrode 64, the drain electrode 66, and the gate electrode 62, PVP was used to form the gate insulating layer 63, photosensitive polyimide was used to form the insulating layer 67, and pentacene was used to form the semiconductor layer 65.

First, as the substrate 61, a washed glass substrate was provided. Photosensitive polyimide was applied to the substrate 61 by spin coating, and the photosensitive polyimide at the portion where the drain electrode 66 was to be formed was removed by the irradiation of light. Thus, the insulating layer 67 was formed. Next, gold was deposited by vacuum evaporation to form the source electrode 64 and the drain electrode 66, and the semiconductor layer 65 was formed successively by evaporation. Next, the PVP gate insulating layer 63 was formed by spin coating. Finally, the gate electrode 62 was formed by vacuum evaporation. On each of the source electrode 64, the drain electrode 66, and the gate electrode 66, a silver wire having a diameter of 0.1 mm was provided using a silver paste. The lifetime of the thus-obtained transistor was evaluated in the same manner as in Example 1.

As clear from Table 1 below, which shows the measurement results with regard to the transistors No. 1 through No. 11 together, the field effect transistor No. 6 immediately after being produced exhibited a carrier mobility of 0.1 cm$^2$/Vs and a current ON/OFF ratio of $7\times10^5$. The field effect transistor No. 6 after being left in the humidifying test machine exhibited an ON/OFF ratio of $8\times10^2$. Thus, it is understood that the top-gate type field effect transistor also exhibited improved resistance to oxygen and water.

Comparative Example 2

Figure 14:
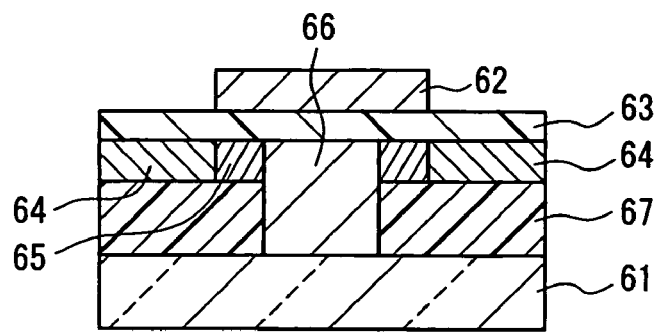
FIG. 14 is a schematic sectional view of a bottom-gate type field effect transistor according to Comparative Example 2.

For the sake of comparison, a field effect transistor No. 7 was produced in the same manner and under the same conditions as in Example 7 so that the field effect transistor No. 7 had the same configuration as that of the transistor according to Example 7 except that, as shown in FIG. 14, the periphery of the gate electrode 62 was the same as that of the semiconductor layer 65. As shown in Table 1, the transistor No. 7 immediately after being produced exhibited a carrier mobility of 0.09 cm$^2$/Vs and a current ON/OFF ratio of $6\times10^5$. The ON/OFF ratio of the transistor No. 7 after being left in the humidifying test machine was so small that it could not be measured. The reason for this is considered to be that, in the transistor with the structure as shown in FIG. 14, the distance oxygen or the like needs to travel to reach the semiconductor layer is shorter than in the transistor with the structure as shown in FIG. 5A. That is, since oxygen or water could enter the semiconductor layer easily, the semiconductor layer was doped with the oxygen or water and degraded chemically, resulting in the degraded transistor characteristics.

Example 7

Figure 5C:
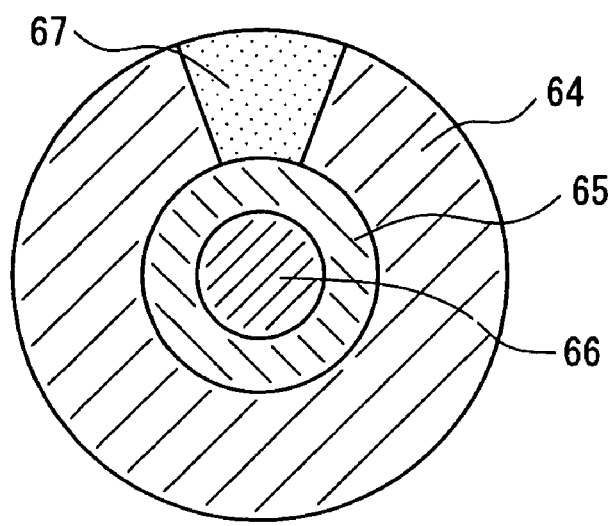
FIG. 5C is a sectional view showing main portions of the top-gate type field effect transistor according to Example 7.

Field effect transistors Nos. 31 to 36 produced in the present example will be described with reference to FIGS. 5A and 5C. In the same manner as in Example 6, top-gate type transistors in which, as shown in FIG. 5A, the gate electrode 62 covered the upper surface of the semiconductor layer 65 completely were produced. The thickness (d) of the insulating layer 63 was 500 nm and the length (L) by which the first electrode (gate electrode) 62 extended beyond the periphery of the semiconductor layer 65 was 50 μm. Thus, the relationship between L and d was L/d=100. The plan view of the source electrode 64, the drain electrode 66, and the semiconductor layer 65 formed on the gate insulating layer 63 was such that, as shown in FIG. 5C, the drain electrode 66 was at the central portion of the semiconductor layer 65 and the most of the lateral portion of the channel region of the semiconductor layer 65 was surrounded with the source electrode 64. Table 3 shows how an ON/OFF ratio varied depending on an opening ratio indicating a ratio of the portion not surrounded with the source electrode 64 in the channel region of the semiconductor layer. In the transistors Nos. 31 to 36, the opening ratio was varied within the range from 0% to 50%. It should be noted here that the term "opening ratio" refers to a ratio of the area of the opening on a side surface of the channel region of the semiconductor layer to the area of the entire side surface. That is, when the opening ratio is 0%, the entire lateral portion of the channel region of the semiconductor layer is surrounded with the source electrode.

Figure 11:
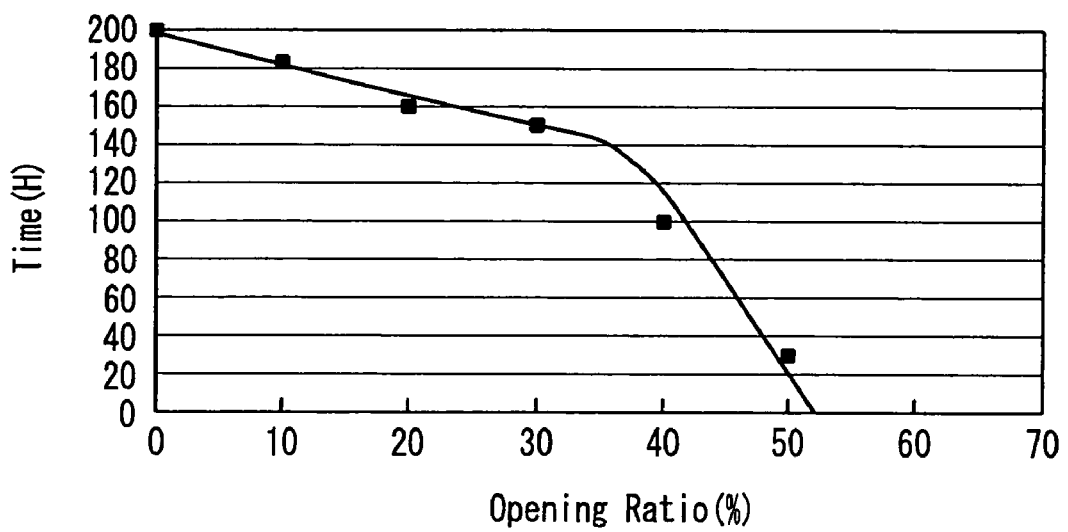
FIG. 11 shows the correlation between an opening ratio of a semiconductor layer and a lifetime of the field effect transistor according to Example 7 of the present invention.

As shown in Table 3, the field effect transistors with various opening ratios exhibited a carrier mobility of 0.06 to 0.1 cm$^2$/Vs and a current ON/OFF ratio of at least 1×10$^5$ immediately after they were produced. These field effect transistors then were left in the humidifying test machine, and a time period that had elapsed until the ON/OFF ratio became smaller than 1×10$^2$ was measured as the lifetime of the field effect transistors. As a result, as shown in FIG. 11, the lifetime decreased monotonically with an increase in opening ratio before the opening ratio exceeded approximately 30%. However, it was found that the lifetime decreased sharply after the opening ratio exceeded approximately 40%. As described with regard to the transistors of Example 3, the cause of the decrease in lifetime is considered to be as follows. That is, when the opening ratio was up to about 30%, the degradation of the semiconductor layer proceeded due to an increase in amount of oxygen entering the semiconductor layer accompany an increase in opening area of the semiconductor layer. When the opening ratio was 40% or more, chemical degradation of the semiconductor layer due to the electric charge concentration accompanying the decrease in electrode area proceeded rapidly, resulting in the decrease in lifetime. However, at present, the reason for this is not completely clear.

From these results, it can be said that, considering the stability of the transistor in use, it is preferable that the lateral portion of the channel region of the semiconductor layer is surrounded with the source electrode so that the opening ratio is in the range causing no sharp decrease in lifetime, i.e., not more than 40%.

Example 8

Figure 6A:
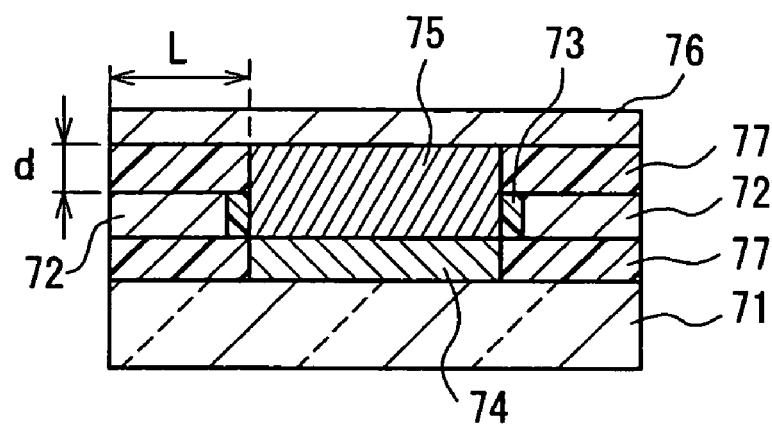
FIG. 6A is a schematic sectional view of a side-gate type field effect transistor according to Example 8 of the present invention.
Figure 6B:
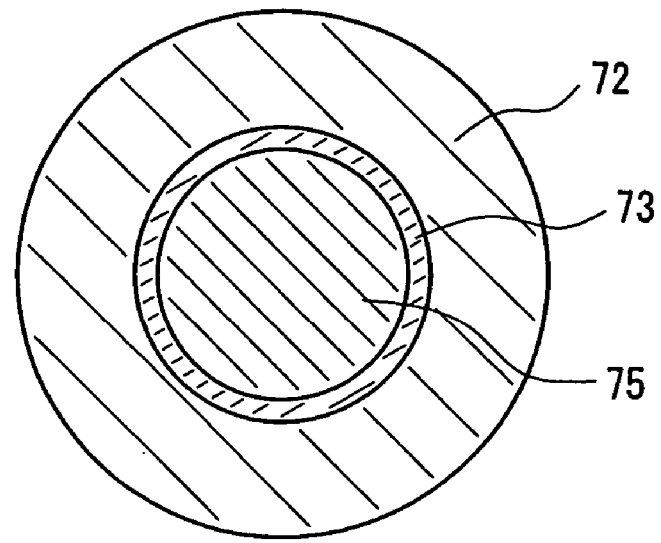
FIG. 6B is a sectional view showing main portions of the same.

A field effect transistor No. 8 produced in the present example will be described with reference to FIG. 6A and FIG. 6B. FIG. 6A shows a side-gate type field effect transistor with a structure in which a source electrode 74 and an insulating layer 77 are formed on a substrate 71, a gate electrode 72, a gate insulating layer 73, and a semiconductor layer 75 are formed thereon, and a drain electrode 76 is formed thereon so as to cover the upper surface of the semiconductor layer 75 completely. The drain electrode 76 covers the inner periphery of the gate electrode 72 completely via another insulating layer 77. Moreover, the plan view of the gate electrode 72, the gate insulating layer 73, and the semiconductor layer 75 formed on the insulating layer 77 and the source electrode 74 is such that, as shown in FIG. 6B, the entire lateral portion of the channel region of the semiconductor layer 75 is surrounded with the gate electrode 72 via the gate insulating layer 73. The thickness (d) of the insulating layer 77 was 50 nm and the length (L) by which the first electrode (drain electrode) 76 extended beyond the periphery of the semiconductor layer 75 was 50 μm. Thus, the relationship between L and d was L/d=1000.

In the production of the field effect transistor No. 8, a glass substrate was used as the substrate 71, gold was used to form the source electrode 74, the drain electrode 76, and the gate electrode 72, photosensitive polyimide was used to form the gate insulating layer 73 and the insulating layers 77, and pentacene was used to form the semiconductor layer 75.

First, as the substrate 71, a washed glass substrate was provided. Photosensitive polyimide was applied to the substrate 71 by spin coating, and the photosensitive polyimide at the portion where the source electrode 74 was to be formed was removed by the irradiation of light. Thus, one of the insulating layers 77 was formed. Next, the source electrode 74 and the gate electrode 72 were formed by vacuum evaporation. Then, photosensitive polyimide was applied by spin coating, and the photosensitive polyimide at the portion where the semiconductor layer 75 was to be formed was removed by the irradiation of light. Thus, the other insulating layer 77 and the gate insulating layer 73 were formed. Finally, the semiconductor layer 75 was formed by evaporation, and the drain electrode 76 was formed successively by vacuum evaporation. The thickness of the semiconductor layer 75 was set to 100 nm. On each of the source electrode 74, the drain electrode 76, and the gate electrode 72, a silver wire having a diameter of 0.1 mm was provided using a silver paste. The lifetime of the thus-obtained transistor was evaluated in the same manner as in Example 1.

As clear from Table 1, the field effect transistor No. 8 immediately after being produced exhibited a carrier mobility of 0.05 cm$^2$/Vs and a current ON/OFF ratio of 4×10$^4$. The field effect transistor No. 8 after being left in the humidifying test machine exhibited an ON/OFF ratio of 1×10$^2$. Thus, it is understood that the side-gate type field effect transistor also exhibited improved resistance to oxygen and water.

Comparative Example 3

Figure 15:
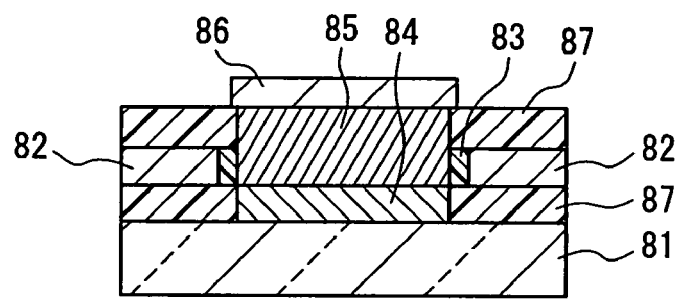
FIG. 15 is a schematic sectional view of a bottom-gate type field effect transistor according to Comparative Example 3.

For the sake of comparison, a field effect transistor was produced under the same conditions as in Example 8, except that, in the structure shown in FIG. 15, the thickness (d) of an insulating layer 87 was set to 100 nm and the length (L) by which a first electrode (drain electrode) 86 extended beyond the periphery of the semiconductor layer 85 was set to 0.1 μm so that the relationship between L and d was L/d=1.

This transistor No. 9 immediately after being produced exhibited a carrier mobility of 0.02 cm$^2$/Vs and a current ON/OFF ratio of 2×10$^4$. The ON/OFF ratio of the transistor No. 9 after being left in the humidifying test machine was so small that it could not be measured. The reason for this is considered to be that, in the transistor with the structure as shown in FIG. 15, the distance oxygen or the like needs to travel to reach the semiconductor layer is shorter than in the transistor with the structure as shown in FIG. 6A. That is, since oxygen or water could enter the semiconductor layer easily, the semiconductor layer was doped with the oxygen or water and degraded chemically, resulting in the degraded transistor characteristics.

Example 9

Figure 7A:
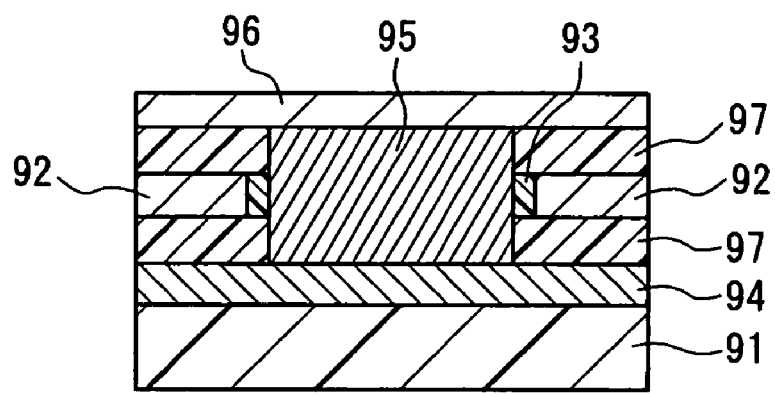
FIG. 7A is a schematic sectional view of a side-gate type field effect transistor according to Example 9 or 10 of the present invention.
Figure 7B:
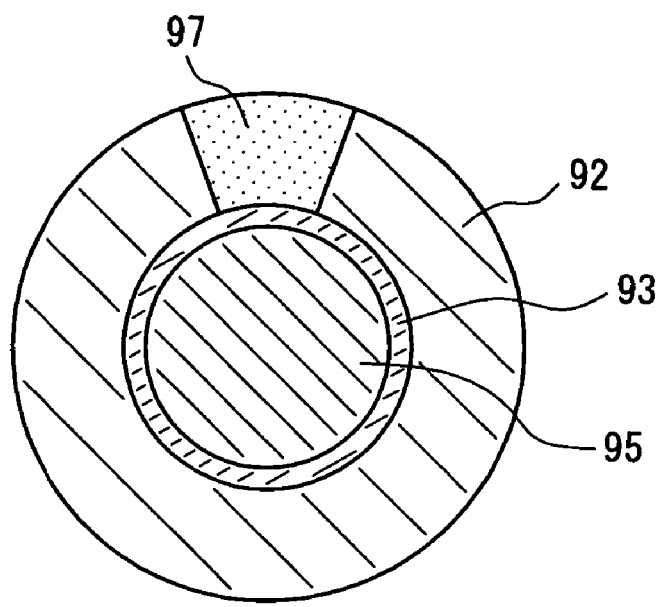
FIG. 7B is a sectional view showing main portions of the same.

A field effect transistor No. 10 produced in the present example will be described with reference to FIG. 7A. FIG. 7A shows a side-gate type field effect transistor with a structure in which a source electrode 94 is formed on a substrate 91, a gate electrode 92, a gate insulating layer 93, and a semiconductor layer 95 are formed thereon, and a drain electrode 96 is formed thereon so that the source electrode 94 and the drain electrode 96 cover the upper and lower surfaces of the semiconductor layer 95 completely. Note here that the drain electrode 96 and the source electrode 94 cover the upper and lower surfaces of the semiconductor layer 95 completely either directly or vie insulating layers 97. Moreover, the plan view of the gate electrode 92, the gate insulating layer 93, and the semiconductor layer 95 formed on the insulating layer 97 and the source electrode 94 is such that, as shown in FIG. 7B, the most of the lateral portion of the channel region of the semiconductor layer 95 is surrounded with the gate electrode 92 via the gate insulating layer 93. The thickness (d) of the insulating layer 97 was 50 nm and the length (L) by which the first electrode (drain electrode) 96 extended beyond the periphery of the semiconductor layer 95 was 50 μm. Thus, the relationship between L and d was L/d=1000.

In the production of the field effect transistor No. 10, a 1 mm thick polyimide resin substrate was used as the substrate 91, gold was used to form the source electrode 94, the drain electrode 96, and the gate electrode 92, photosensitive polyimide was used to form the gate insulating layer 93 and the insulating layers 97, and pentacene was used to form the semiconductor layer 95.

First, as the substrate 91, a washed resin substrate was provided, and the source electrode 94 was formed on the substrate 91 by vacuum evaporation. Then, photosensitive polyimide was applied by spin coating, and the photosensitive polyimide at the portion where the semiconductor layer 95 was to be formed was removed by the irradiation of light. Thus, one of the insulating layers 97 was formed. Next, gold was deposited by vacuum evaporation to form the gate electrode 92. Subsequently, photosensitive polyimide was applied by spin coating, and the photosensitive polyimide at the portion where the semiconductor layer 95 was to be formed was removed by the irradiation of light. Thus, the gate insulating layer 93 and the other insulating layer 97 were formed. Finally, the semiconductor layer 95 was formed by evaporation, and the drain electrode 96 was formed successively by vacuum evaporation. The thickness of the semiconductor layer 95 was set to 150 nm. On each of the source electrode 94, the drain electrode 96, and the gate electrode 92, a silver wire having a diameter of 0.1 mm was provided using a silver paste. The lifetime of the thus obtained transistor was evaluated in the same manner as in Example 1.

As clear from Table 1, the field effect transistor No. 10 immediately after being produced exhibited a carrier mobility of 0.03 $cm^2$/Vs and a current ON/OFF ratio of $2\times10^4$. The field effect transistor No. 10 after being left in the humidifying test machine exhibited an ON/OFF ratio of $9\times10^2$. Thus, it is understood that, in the case where the substrate made of resin was used, the field effect transistor exhibited improved resistance to oxygen and water.

Example 10

Field effect transistors Nos. 41 to 46 produced in the present example will be described with reference to FIGS. 7A and 7B. FIG. 7A shows a side-gate type transistor with the same structure as described in Example 9. Note here that the plan view of the gate electrode 92, the gate insulating layer 93, and the semiconductor layer 95 formed on the electrically insulating layer 97 and the source electrode 94 was such that, as shown in FIG. 7B, the most of the lateral portion of the channel region of the semiconductor layer 95 was surrounded with the gate electrode 92 via the gate insulating layer 93. Table 3 shows how an ON/OFF ratio varied depending on an opening ratio indicating a ratio of the portion not surrounded with the gate electrode 92 in the semiconductor layer. In the transistors Nos. 41 to 46, the opening ratio was varied within the range from 0% to 50%. It should be noted here that the term "opening ratio" refers to a ratio of the area of the opening on a side surface of the channel region of the semiconductor layer to the area of the entire side surface. That is, when the opening ratio is 0%, the entire lateral portion of the channel region of the semiconductor layer is surrounded with the gate electrode via the gate insulating layer. The thickness (d) of the insulating layer 97 was 50 nm and the length (L) by which the first electrode (drain electrode) 96 extended beyond the periphery of the semiconductor layer 95 was 50 μm. Thus, the relationship between L and d was L/d=1000.

Figure 12:
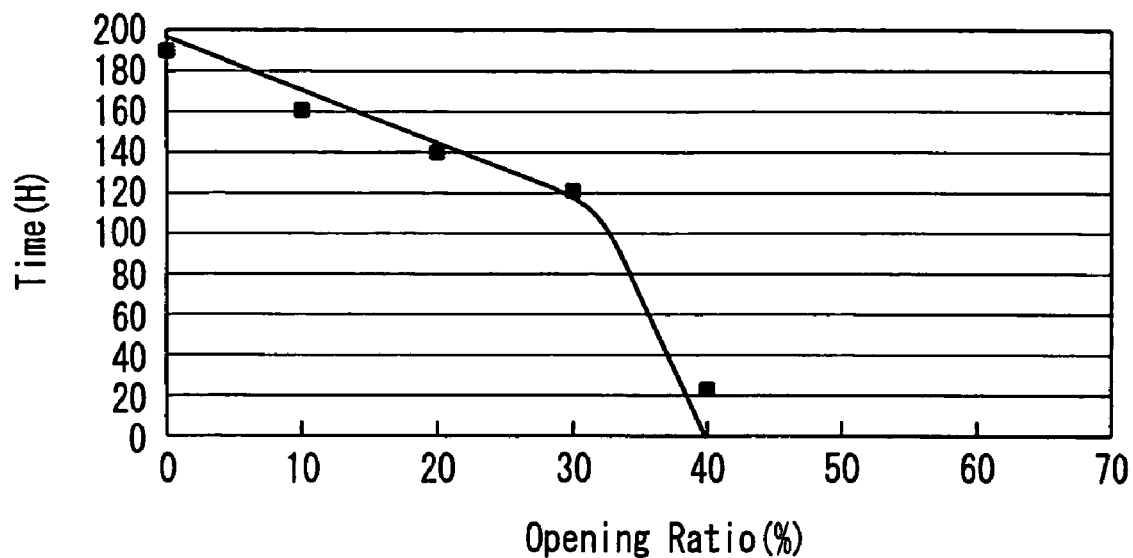
FIG. 12 shows the correlation between an opening ratio of a semiconductor layer and a lifetime of the field effect transistor according to Example 10 of the present invention.

As shown in Table 4, the field effect transistors with various opening ratios exhibited a carrier mobility of 0.02 to 0.03 $cm^2$/Vs and a current ON/OFF ratio of at least $5\times10^3$ immediately after they were produced. These field effect transistors then were left in the humidifying test machine, and a time period that had elapsed until the ON/OFF ratio became smaller than $1\times10^2$ was measured as the lifetime of the field effect transistors. As a result, as shown in FIG. 12, the lifetime decreased monotonically with an increase in opening ratio before the opening ratio exceeded approximately 30%. However, it was found that the lifetime decreased sharply after the opening ratio exceeded approximately 40%. As described with regard to the transistors of Example 3, when the opening ratio was up to about 30%, the main reason for the degradation of the transistor characteristics is that the semiconductor layer was doped with oxygen or the like due to an increase in opening area of the semiconductor layer. However, when the opening ratio was 40% or more, the sharp decrease in the lifetime of the semiconductor layer occurred because electric charge concentration accompanying the decrease in electrode area caused chemical degradation of the semiconductor layer to proceed rapidly.

From these results, it can be said that, considering the stability of the transistor in use, it is preferable that the side surface of the channel region of the semiconductor layer is surrounded with the source electrode so that the opening ratio is in the range causing no sharp decrease in lifetime, i.e., not more than 40%.

Example 11

Figure 8A:
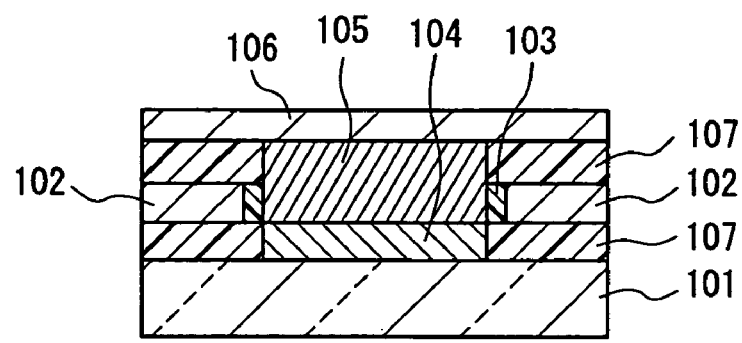
FIG. 8A is a schematic sectional view of a side-gate type field effect transistor according to Example 11 of the present invention.
Figure 8B:
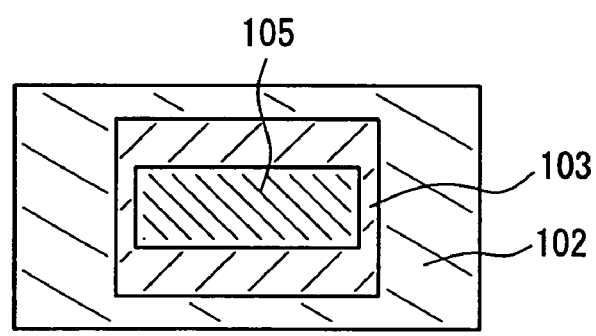
FIG. 8B is a sectional view showing main portions of the same.

A field effect transistor No. 11 produced in the present example will be described with reference to FIGS. 8A and 8B. FIG. 8A shows a side-gate type field effect transistor with a structure in which a source electrode 104 and an insulating layer 107 are formed on a substrate 101, a gate electrode 102, a gate insulating layer 103, and a semiconductor layer 105 are formed thereon, and a drain electrode 106 is formed thereon so that the source electrode 104 and the drain electrode 106 cover the upper and lower surfaces of the semiconductor layer 105 completely. The plan view of the gate electrode 102, the gate insulating layer 103, and the semiconductor layer 105 formed on the insulating layer 107 and the source electrode 104 is such that, as shown in FIG. 8B, the entire lateral portion of the channel region of the semiconductor layer 105 is surrounded with the gate electrode 102 via the gate insulating layer 103. The thickness (d) of the insulating layer 107 was 50 nm and the length (L) by which the first electrode (drain electrode) 106 extended beyond the periphery of the semiconductor layer 105 was 50 μm. Thus, the relationship between L and d was L/d=1000.

In the production of the field effect transistor, a 1 mm thick polyimide resin substrate was used as the substrate 101, gold was used to form the source electrode 104, the drain electrode 106, and the gate electrode 102, photosensitive polyimide was used to form the gate insulating layer 103 and the insulating layers 107, and pentacene was used to form the semiconductor layer 105.

First, as the substrate 101, a washed resin substrate was provided. Photosensitive polyimide was applied to the substrate 101 by spin coating, and the photosensitive polyimide at the portion where the source electrode 104 was to be formed was removed by the irradiation of light. Thus, one of the insulating layers 107 was formed. Next, the source electrode 104 and the gate electrode 102 were formed by vacuum evaporation. Then, photosensitive polyimide was applied by spin coating, and the photosensitive polyimide at the portion where the semiconductor layer 105 was to be formed was removed by the irradiation of light. Thus, the other insulating layer 107 and the gate insulating layer 103 were formed. Finally, the semiconductor layer 105 was formed by evaporation, and the drain electrode 106 was formed successively by vacuum evaporation. The thickness of the semiconductor layer 105 was set to 100 nm. On each of the source electrode 104, the drain electrode 106, and the gate electrode 102, a silver wire having a diameter of 0.1 mm was provided using a silver paste. The lifetime of the thus obtained transistor was evaluated in the same manner as in Example 1.

As clear from Table 1, the field effect transistor No. 11 immediately after being produced exhibited a carrier mobility of 0.05 $cm^2/Vs$ and a current ON/OFF ratio of $3 \times 10^4$. The field effect transistor No. 11 after being left in the humidifying test machine exhibited an ON/OFF ratio of $4 \times 10^2$. From these results, it is understood that the field effect transistor exhibited improved resistance to oxygen and water regardless of the shapes of the gate electrode, the gate insulating layer, and the semiconductor layer.

TABLE 1

| Experiment No. | Carrier mobility ($cm^2/Vs$) | ON/OFF ratio immediately after production | ON/OFF ratio after being left in humidified conditions |
|---|---|---|---|
| 1 | 0.06 | $5 \times 10^5$ | $9 \times 10^2$ |
| 2 | 0.04 | $4 \times 10^5$ | unmeasurable |
| 3 | 0.10 | $4 \times 10^5$ | $4 \times 10^2$ |
| 4 | 0.03 | $2 \times 10^5$ | $1 \times 10^2$ |
| 5 | 0.01 | $6 \times 10^4$ | $1 \times 10^2$ |
| 6 | 0.10 | $7 \times 10^5$ | $8 \times 10^2$ |
| 7 | 0.09 | $6 \times 10^5$ | unmeasurable |
| 8 | 0.05 | $4 \times 10^4$ | $1 \times 10^3$ |
| 9 | 0.02 | $2 \times 10^4$ | unmeasurable |
| 10 | 0.03 | $2 \times 10^4$ | $9 \times 10^2$ |
| 11 | 0.05 | $3 \times 10^4$ | $4 \times 10^2$ |

TABLE 2

| Experiment No. | Opening ratio (%) | Carrier mobility ($cm^2/Vs$) | ON/OFF ratio | Lifetime (h) |
|---|---|---|---|---|
| 21 | 0 | 0.10 | $4 \times 10^5$ | 198 |
| 22 | 10 | 0.09 | $2 \times 10^5$ | 184 |
| 23 | 20 | 0.08 | $3 \times 10^5$ | 153 |
| 24 | 30 | 0.09 | $1 \times 10^5$ | 142 |
| 25 | 40 | 0.07 | $1 \times 10^5$ | 87 |
| 26 | 50 | 0.08 | $2 \times 10^5$ | 12 |

TABLE 3

| Experiment No. | Opening ratio (%) | Carrier mobility ($cm^2/Vs$) | ON/OFF ratio | Lifetime (h) |
|---|---|---|---|---|
| 31 | 0 | 0.10 | $7 \times 10^5$ | 195 |
| 32 | 10 | 0.09 | $6 \times 10^5$ | 186 |
| 33 | 20 | 0.07 | $4 \times 10^5$ | 159 |
| 34 | 30 | 0.06 | $5 \times 10^5$ | 150 |
| 35 | 40 | 0.07 | $4 \times 10^5$ | 100 |
| 36 | 50 | 0.06 | $3 \times 10^5$ | 30 |

TABLE 4

| Experiment No. | opening ratio (%) | Carrier mobility ($cm^2/Vs$) | ON/OFF ratio | Lifetime (h) |
|---|---|---|---|---|
| 41 | 0 | 0.03 | $2 \times 10^4$ | 187 |
| 42 | 10 | 0.03 | $1 \times 10^4$ | 159 |
| 43 | 20 | 0.02 | $1 \times 10^4$ | 142 |
| 44 | 30 | 0.03 | $5 \times 10^3$ | 124 |
| 45 | 40 | 0.03 | $7 \times 10^3$ | 25 |
| 46 | 50 | 0.02 | $6 \times 10^3$ | — |

Example 12

Figure 9:
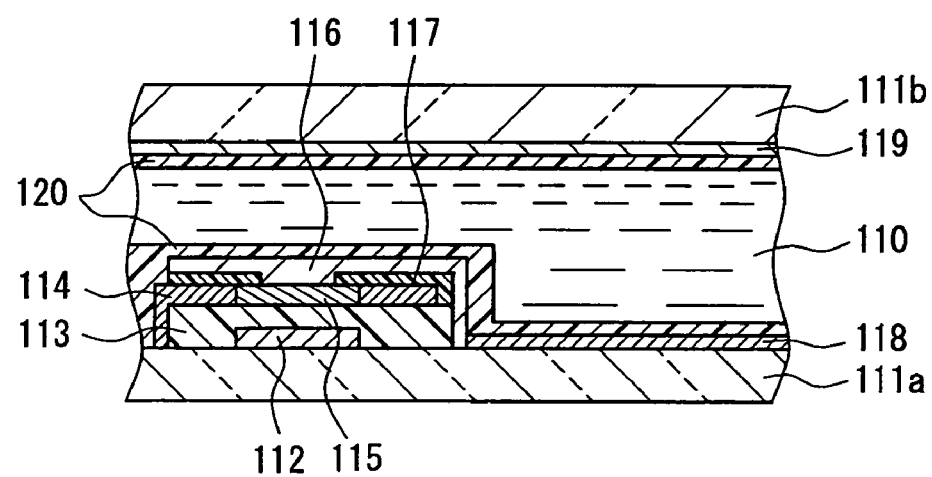
FIG. 9 is a sectional view of a liquid crystal element using a bottom-gate type field effect transistor according to Example 12 of the present invention.

FIG. 9 shows an active-matrix liquid crystal display device according to the present example. First, an ITO gate electrode 112 and a pixel electrode 118 were formed on a glass substrate 111a by sputtering and photography. Next, a field effect transistor was formed in the manner described in Example 1. Note here that gold was used as a material of the source electrode 114 and the drain electrode 116. Next, to a glass substrate 111b with an ITO transparent electrode 119, which would serve as a substrate opposing a liquid crystal element, an alignment film 120 was applied. Then, the substrate 111b and the substrate 111a provided with the transistor were subjected to a rubbing treatment. Finally, this pair of substrates 111a and 111b were attached to each other via beads, and liquid crystal was injected and sealed using a vacuum injector. Thus, the liquid crystal display device was obtained.

A lighting test was performed to evaluate the display characteristics of the thus obtained liquid crystal display device. As a result, it was found that the liquid crystal display device exhibited a drain voltage of 8 V and a contrast ratio at the pixel portion of 120 and thus had excellent display characteristics. Furthermore, in order to evaluate the lifetime of the liquid crystal display device, the lighting test was performed after the liquid crystal display device had been left in a humidifying test machine for seven days. As a result, the liquid crystal display device exhibited a contrast ratio of 115 and thus could operate as a display device.

Example 13

In a field effect transistor with the structure described in Example 1, the length (L) by which the first electrode (drain electrode) 16 extended beyond the periphery of the semiconductor layer 15 was varied, while maintaining the thickness (d) of the insulating layer 17 at 50 nm. With regard to the transistors having the L/d values shown in Table 5, the carrier mobility and the current ON/OFF ratio immediately after being produced were measured. Thereafter, the current ON/OFF ratio of the same after being left in the humidifying test machine for seven days was measured.

TABLE 5

| Experiment No. | L/d | Carrier mobility ($cm^2/Vs$) | ON/OFF ratio immediately after production | ON/OFF ratio after being left in humidified conditions |
|---|---|---|---|---|
| 51 | 0.8 | 0.05 | $5 \times 10^5$ | unmeasurable |
| 52 | 2.5 | 0.06 | $5 \times 10^5$ | $1 \times 10$ |
| 53 | 5 | 0.05 | $5 \times 10^5$ | $2 \times 10$ |
| 54 | 10 | 0.04 | $4 \times 10^5$ | $5 \times 10$ |

TABLE 5-continued

| Experiment No. | L/d | Carrier mobility (cm$^2$/Vs) | ON/OFF ratio immediately after production | ON/OFF ratio after being left in humidified conditions |
|---|---|---|---|---|
| 55 | 25 | 0.06 | 6 × 10$^5$ | 7 × 10 |
| 56 | 50 | 0.06 | 6 × 10$^5$ | 1 × 10$^2$ |
| 57 | 100 | 0.05 | 5 × 10$^5$ | 2 × 10$^2$ |
| 58 | 500 | 0.06 | 5 × 10$^5$ | 8 × 10$^2$ |

Example 14

Figure 16:
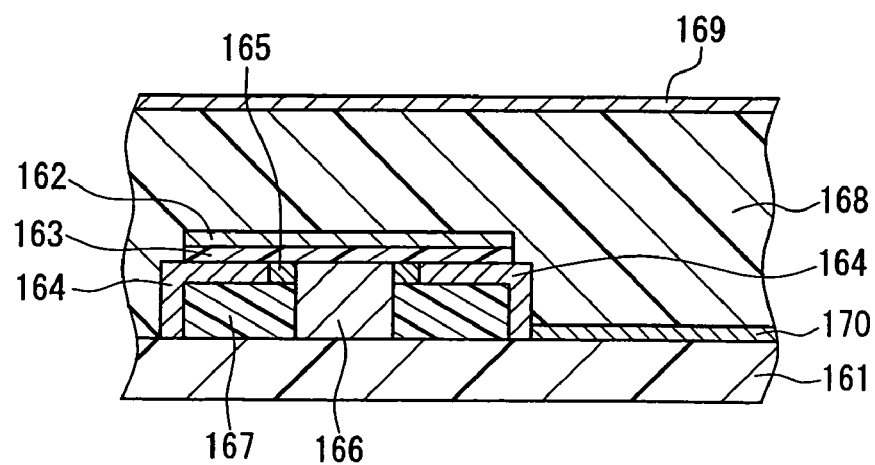
FIG. 16 is a sectional view of an active-matrix organic EL display device according to Example 14 of the present invention.

FIG. 16 shows an active-matrix organic EL display device according to the present example. First, on a plastic substrate 161, a source electrode 164, a drain electrode 166, a gate electrode 162, and a pixel electrode 170 were formed using gold, a gate insulating layer 163 was formed using PVP, and an insulating layer 167 was formed using photosensitive polyimide, and a semiconductor layer 165 was formed using pentacene. Thus, a top-gate type transistor was produced. Thereafter, 200 nm of a triphenyldiamine derivative/aluminum quinolinol complex was deposited by evaporation to from an organic EL layer 168, and then 50 nm of indium-tin oxide was deposited by evaporation to form a surface electrode 169. Thus, an organic EL display device was produced.

A lighting test was performed to evaluate the organic EL display device. As a result, it was found that the organic EL display device could be lit even after being left in a humidifying test machine for seven days.

INDUSTRIAL APPLICABILITY

A field effect transistor according to the present invention is advantageous in that it is highly resistant to oxygen and water and thus has a long lifetime though it uses an organic semiconductor layer. Accordingly, the field effect transistor of the present invention is useful as a transistor to be applied to active-matrix displays and the like in which pixels are driven using an organic transistor.

The invention claimed is:

1. A field effect transistor comprising:
a semiconductor layer containing an organic substance;
a first electrode;
a second electrode;
a third electrode, and
an insulating layer interposed between the first electrode and the third electrode,
wherein the first electrode is arranged above the semiconductor layer,
the second electrode is arranged below the semiconductor layer,
the third electrode is arranged beside the semiconductor layer,
the semiconductor layer is connected electrically to two electrodes selected from the first electrode, the second electrode, and the third electrode,
the first electrode lies over the whole semiconductor layer and extends beyond a periphery of the semiconductor layer,
the first electrode is a drain/source electrode and is connected electrically to the semiconductor layer,
the second electrode is a gate electrode,
the third electrode is a source/drain electrode and is connected electrically to the semiconductor layer, and
L≧10d is satisfied where L is a length by which the first electrode extends beyond the periphery of the semiconductor layer and d is a thickness of the insulating layer.

2. The field effect transistor according to claim 1, wherein the L and the d satisfy L≧50d.

3. The field effect transistor according to claim 1, wherein the semiconductor layer is at least partially surrounded by the third electrode and an opening ratio indicating a ratio of a portion not surrounded with the third electrode in a lateral portion of the semiconductor layer to the entire lateral portion is not less than 0% and not more than 40%.

4. A display device comprising:
an image display portion; and
a pixel electrode provided with the field effect transistor according to claim 1.

5. The display device according to claim 4, wherein the image display portion is a liquid crystal display device or an organic electroluminescence display device.

6. A field effect transistor comprising:
a semiconductor layer containing an organic substance;
a first electrode;
a second electrode;
a third electrode, and
an insulating layer interposed between the first electrode and the third electrode,
wherein the first electrode is arranged above the semiconductor layer,
the second electrode is arranged below the semiconductor layer,
the third electrode is arranged beside the semiconductor layer,
the semiconductor layer is connected electrically to two electrodes selected from the first electrode, the second electrode, and the third electrode,
the first electrode lies over the whole semiconductor layer and extends beyond a periphery of the semiconductor layer,
the first electrode is a gate electrode,
the second electrode is a drain/source electrode and is connected electrically to the semiconductor layer,
the third electrode is a source/drain electrode and is connected electrically to the semiconductor layer, and
L≧10d is satisfied where L is a length by which the first electrode extends beyond the periphery of the semiconductor layer and d is a thickness of the insulating layer.

7. The field effect transistor according to claim 6, wherein the L and the d satisfy L≧50d.

8. The field effect transistor according to claim 6, wherein the semiconductor layer is at least partially surrounded by the third electrode and an opening ratio indicating a ratio of a portion not surrounded with the third electrode in a lateral portion of the semiconductor layer to the entire lateral portion is not less than 0% and not more than 40%.

9. A display device comprising:
an image display portion; and
a pixel electrode provided with the field effect transistor according to claim 6.

10. The display device according to claim 9, wherein the image display portion is a liquid crystal display device or an organic electroluminescence display device.

* * * * *